(12) United States Patent
Fujioka

(10) Patent No.: US 6,822,157 B2
(45) Date of Patent: Nov. 23, 2004

(54) THIN FILM SOLAR BATTERY MODULE

(75) Inventor: Yasushi Fujioka, Soraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 77 days.

(21) Appl. No.: 10/270,184

(22) Filed: Oct. 15, 2002

(65) Prior Publication Data
US 2003/0070706 A1 Apr. 17, 2003

(30) Foreign Application Priority Data
Oct. 15, 2001 (JP) .................................... 2001-317091

(51) Int. Cl.[7] ............................................ H01L 31/048
(52) U.S. Cl. .................. 136/251; 136/256; 136/246; 136/259; 136/258; 136/261; 257/53; 257/433; 257/434; 257/436; 257/437
(58) Field of Search .................... 136/251, 256, 136/246, 259, 258, 261; 257/53, 433, 434, 436, 437

(56) References Cited

U.S. PATENT DOCUMENTS

| | | | | |
|---|---|---|---|---|
| 3,883,339 A | * | 5/1975 | Michalik et al. ............ 65/114 |
| 4,286,743 A | * | 9/1981 | Vasseur et al. .......... 228/124.1 |
| 4,880,677 A | * | 11/1989 | Hecq et al. .................... 428/38 |
| 6,365,823 B1 | | 4/2002 | Kondo ........................ 136/246 |
| 6,384,318 B1 | * | 5/2002 | Nomura ...................... 136/256 |
| 6,462,266 B1 | * | 10/2002 | Kurth .......................... 136/251 |
| 6,538,195 B1 | * | 3/2003 | Shi et al. ..................... 136/259 |
| 2003/0010378 A1 | * | 1/2003 | Yoda et al. ................. 136/251 |

FOREIGN PATENT DOCUMENTS

| | | | |
|---|---|---|---|
| EP | 991129 A1 | * | 4/2000 |
| JP | 3-200378 A | * | 9/1991 |
| JP | 6-45628 A | * | 2/1994 |
| JP | 11-74552 | | 3/1999 |
| JP | 2001-53315 | | 2/2001 |

* cited by examiner

Primary Examiner—Alan Diamond
(74) Attorney, Agent, or Firm—Nixon & Vanderhye P.C.

(57) ABSTRACT

In a thin film solar battery module, a flat glass substrate with non-monocrystal silicon type thin film solar cells formed thereon, a space layer, and a chilled figured glass are sequentially stacked in this order. The chilled figured glass has fine unevenness on at least its incident side surface to achieve an anti-glare effect.

13 Claims, 3 Drawing Sheets

THIN FILM SOLAR BATTERY MODULE

BACKGROUND OF THE INVENTION

1. Field of the Invention

The present invention relates to a thin film solar battery module, particularly to improvement in strength and appearance of the module.

2. Description of the Background Art

Thin film solar batteries have the advantage of needing less amount of semiconductor material as compared with solar batteries using crystal wafers. It is also appreciated that a thin film solar battery can be formed at a relatively low temperature on an inexpensive substrate such as of glass or metal. Thus, saving in terms of costs is expected with the thin film solar batteries.

Among thin film solar batteries, non-monocrystal silicon type thin film solar batteries that use amorphous silicon, thin film polycrystalline silicon or the like are preferable in view of the abundant existence of silicon material and in view that the silicon material is harmless and has no adverse effect on the environment as compared to a compound type solar battery containing Cd, Se or the like. It is thus expected that non-monocrystal silicon type thin film solar batteries will generally be used.

An amorphous silicon solar battery has a transparent electrode layer such as of $SnO_2$ or ZnO, a p-i-n amorphous silicon type semiconductor layer, and a metal back electrode layer sequentially stacked on a transparent substrate such as of glass. In the layering processes, each layer is divided into a plurality of elongated rectangular cell regions through scribing using a laser beam or the like. An integrated structure is thus formed wherein the divided cell regions are electrically connected in series in the direction of narrow width of the cells.

The back surface side of the thin film solar battery is sealed with a filler such as ethylene vinyl acetate (EVA) or polyvinyl butyral, and/or a multilayered sheet of polyethylene terephthalate (PET)/aluminum/PET or a back sheet such as Tedler (trademark) to form a super straight type solar battery panel (hereinafter also termed "module"). Such a thin film solar battery module is mounted to a support member such as an aluminum frame, and then generally used outdoors.

Costs of a thin film solar battery module are expected to be reduced from a viewpoint of thinness of the semiconductor layer needed for power generation, the requirement of only one mechanical structure material, simple wiring, and the like.

In a thin film solar battery module that uses a glass substrate, the flat glass substrate on which the thin film semiconductor material is to be deposited forms the front surface of the module. In the case where such a solar battery module is installed on the roof of a house or on the top or wall of a building or architecture, the front surface of the module will act as a mirror. The glare of the sun light reflected by the module will bother the eyes of the people in the neighborhood. Furthermore, the scene in the neighborhood or the clouds in the sky will be mirrored on the front surface of the solar battery module to degrade the appearance of the house or architecture to which the module is installed.

To cope with the problem of surface reflection on a solar battery module employing a flat glass substrate, conventional approaches set forth below are known.

For example, in a crystal type solar battery module, a figured glass (having a fine uneven surface) is generally employed as a cover glass protecting silicon wafers, so that the figured cover glass can also serves as an anti-glare measures for diffusing light.

With regards to a thin film solar battery module, it is disclosed in Japanese Patent Laying-Open No. 11-74552 to use a figured glass as a substrate of the module having fine unevenness on its outer surface. Japanese Patent Laying-Open No. 2001-53315 discloses that a resin containing mixed beads for diffusing light is applied on a flat surface of a glass substrate.

In a thin film solar battery module that employs a glass substrate, the glass substrate constituting the outermost surface of the module must be strong enough to withstand wind pressure, hailstorms and the like so that the thin film solar battery module having a relatively large area to obtain sufficient generated electrical power can be used outdoors.

By using a chilled glass for the glass substrate, the strength of the glass substrate will be increased, and thickness thereof can be controlled. However, it is difficult to use a chilled glass effectively for the glass substrate in a thin film solar battery. Specifically, a thin film solar battery has a transparent electrode layer such as of $SnO_2$ formed on the glass substrate. In order to economically form a transparent electrode layer on a glass substrate of a large area, thermal CVD (chemical vapor deposition) of a high temperature process is generally employed. This means that even if a flat glass chilled by a heat treatment is employed for the substrate, the chilled glass substrate will be annealed during the high temperature process of forming the transparent electrode layer, whereby the strengthening effect due to the chilling will be lost.

The glass substrate of a thin film solar battery module for relatively large power must be at least 3 mm in thickness to ensure its strength. However, a thicker glass substrate will increase light absorption caused by the glass to induce a problem that the power generation efficiency is degraded. Particularly in the case where the economical flat soda lime glass is employed as the material of the glass substrate, light absorption caused by the glass is so much that the power generation efficiency is significantly degraded.

In the above-described measures to use a figured glass having a fine uneven surface as the substrate (Japanese Patent Laying-Open No. 11-74552) in relation to the problem of reflection on the glass substrate surface in a thin film solar battery module, there is a problem that patterning is difficult in the laser patterning step carried out for fabrication of the thin film solar battery module, because the laser beam is scattered at the uneven surface of the glass substrate.

Also, in the measures wherein a resin containing mixed beads for scattering light is applied on the surface of a flat glass substrate (Japanese Patent Laying-Open No.2001-53315), there is a problem as to weather resistance of the resin. There is also a problem that it is difficult to form homogeneous unevenness on the surface of the glass substrate of a large area and then the appearance of the module is degraded.

In order to solve the problem of reduction in the power generation efficiency caused by light absorption in the glass substrate, a low iron glass plate of high transmittance whose usage is particularly limited to certain applications such as the glass for showrooms in museums and the like can be employed instead of the economical flat soda lime glass that is typically used in the module. However, the low iron glass plate is so expensive as to restrict cost reduction that is one advantage of the thin film solar battery.

SUMMARY OF THE INVENTION

In view of the foregoing, an object of the present invention is to provide an economical thin film solar battery module that can reduce the undesirable effects caused by light reflected from the glass surface of the module and that can have sufficient strength without reduction in power generation efficiency.

In a thin film solar battery module of the present invention, a flat glass substrate with non-monocrystal silicon type thin film solar cells formed thereon, a space layer, and a chilled figured glass are stacked in this order. At least the light incident side of the chilled figured glass has a fine surface unevenness to cause an anti-glare effect.

The arithmetic mean surface roughness Ra of the fine unevenness on the surface of the chilled figured glass is preferably in the range of 0.001 mm–0.3 mm. Also preferably, the chilled figured glass has an average thickness more than 3 mm and is formed of low iron glass.

The flat glass substrate is preferably a flat soda lime glass having a thickness of less than 3 mm. The flat glass substrate is preferably a flat glass that is not chilled.

The space layer is preferably a dry air layer, a dry inert gas layer, or a vacuum layer. At least one of the space layer side surfaces of the chilled figured glass and the flat glass substrate is preferably provided with an anti-reflection film. A thermal insulation member is preferably provided on the back surface side of the non-monocrystal silicon type thin film solar battery.

Further specific descriptions related to the thin film solar battery module of the present invention are provided below.

As the case that a conventional thin film solar battery is provided with a transparent protection sheet on its light incident side in addition to a substrate, a solar watch having a solar battery incorporated in its dial and a garden light using a solar battery for its power source are available on the market. However, when such a conventional thin film solar battery is used outdoors, the anti-glare effect of the solar battery is not taken into account.

In the case of a watch, the face of its cover glass may have a gentle curved plane or facets formed by cutting to improve the design of the watch. However, the entire cover glass will not be provided with fine surface unevenness for achieving the anti-glare effect, because the dial of the watch must be precisely readable. As to a solar battery for relatively small power use such as for a garden light used outdoors, the anti-glare function and surface strength of the transparent protection plate are not of great concern, because the area of the solar battery is relatively small. In such a case, therefore, it is not considered forming fine unevenness for the anti-glare effect on the surface of the transparent protection plate or using a chilled glass for the transparent protection plate. Although measures to provide a transparent sheet of polycarbonate, acryl or the like for a partial outer cover of a thin film solar battery is adopted in the conventional art, a surface cover glass integrated with the solar battery in addition to the glass substrate is not used.

In contrast to the above conventional art, the chilled figured glass having fine surface unevenness and made stronger in the thin film solar battery module of the present invention carries out the two functions of preventing the glare and retaining the strength, while the thin film solar cells formed on the thin flat glass substrate carries out the power generation function. Furthermore, reduction in the costs of the thin film solar battery module can be realized by saving the material costs through use of glass material (flat soda lime glass, chilled figured low iron glass, and the like) available in mass production and by simplifying the fabrication processes through use of a glass substrate imposing less loads on the processes.

In other words, by using an inexpensive flat glass (flat soda lime glass) substrate not chilled instead of a figured glass substrate having a fine uneven surface and by placing a chilled figured low iron glass having a fine uneven surface with a space layer on the light incident side of the flat glass substrate, the advantages of ensuring the strength, preventing the glare, and reducing the costs can be realized at the same time in relation to patterning processes for integration of thin film solar cells in the thin film solar battery module of the present invention.

In the present invention, the flat glass substrate with non-monocrystal silicon type thin film solar cells formed thereon and the chilled figured glass having a fine uneven surface are not adhered by means of a resin or the like, but the space layer is provided between the flat glass substrate and the chilled figured glass. Therefore, there is no light absorption by the adhesive resin or the like, so that loss of light incident to the solar cells is reduced.

Although light reflection slightly occurs on the glass surface facing the space layer, that light reflection can be reduced by forming an anti-reflection film on the glass surface. For such an anti-reflection film, a transparent film of a low refraction index such as of magnesium fluoride or fluorine-contained resin or a multilayered film including a plurality of layers having different refraction indexes can be employed.

In the present invention, the flat glass substrate with non-monocrystal silicon type thin film solar cells formed thereon is thermally isolated from the face glass plate (chilled figured glass) of the module by means of the space layer. Therefore, heat generated by incident light in the thin film solar cell does not easily escape from the face side the module, so that temperature rise of the thin film solar cells during insolation can be increased.

It is known that a thin film solar cell formed of an amorphous semiconductor such as amorphous silicon has little output reduction caused by temperature rise and is capable of heat recovery from the light degradation by the so-called Staebler-Wronski effect. In other words, it is generally known that a higher photoelectric conversion efficiency can be achieved at a higher module temperature during insolation in an amorphous thin film solar battery module.

Since the space layer and chilled figured glass are provided on the light incident side of the flat glass substrate with non-monocrystal silicon type thin film solar cells formed thereon in the present invention, good thermal insulation is provided on the face side of the module, and the temperature of the thin film solar cells is increased. Therefore, a high photoelectric conversion efficiency can be maintained during using the module outdoors.

The space layer provided between the chilled figured glass and the flat glass substrate in the present invention preferably forms a structure that prevents intrusion of moisture, dust and the like into the space layer during using the module outdoors. If the space layer located between the chilled figured glass and the flat glass substrate is permeated by moisture, it is liable that cloud or dew condensation occurs on the surface of the glass causing not only absorption and reflection of the incident light but also oxidation and delamination of the thin film including a semiconductor layer and a metal layer. Absorption and reflection of the incident light will occur also in the case that dust enters the space layer.

To prevent such intrusion of moisture and dust, a seal member for sealing the perimeter of the space layer is preferably provided between the glass sheets. The space layer is preferably formed as a dry air layer, an inert gas layer including dry nitrogen, dry argon, or the like, or a vacuum layer.

The space layer preferably has such a thickness as not to compress the flat glass substrate even if the chilled figured glass is deformed by external force such as wind pressure or the like. Furthermore, the space layer preferably has a thickness such that a thickness of the entire module can readily be accommodated in a support member such as an aluminum frame. Specifically, the thickness of the space layer is preferably within the range of 1 mm–30 mm.

Since the strength of the thin film solar battery module is retained by the chilled figured glass in the present invention as mentioned above, the flat glass substrate with the non-monocrystal silicon type thin film solar cells formed thereon can be reduced in thickness.

For example, many solar battery modules for relatively large power have an area of approximately 0.5 m$^2$–1 m$^2$. If the strength resistant to pressure of wind and impact of hail and the like (the strength defined by JIS C8938 and JIS C8939) is to be retained by the glass substrate alone in a conventional thin film solar battery module of such a large dimension, the thickness of at least 3 mm will be required for the non-chilled flat glass substrate. However, the thickness of the glass substrate can be set to less than 3 mm in the present invention,.

A thinner glass substrate allows reduction in absorption of light incident thereon. It is therefore possible to use a flat soda lime glass that is inexpensive, though not so high in transmittance, for the glass substrate instead of the expensive low ion flat glass.

In fabrication processes of a non-monocrystal silicon type thin film solar battery, plasma CVD (Chemical Vapor Deposition) and sputtering are generally employed. When a thin film is to be formed by such vapor deposition, a glass substrate must be heated to a temperature suitable for the film deposition. Since a thinner glass substrate has a smaller heat capacity to allow high speed heating, an advantage can be expected of improving the productivity of thin film solar batteries.

From the situation as described above, it is preferable to use a flat soda lime glass for the flat glass substrate in the present invention. The thickness of the flat glass substrate is preferably less than 3 mm, more preferably less than 2 mm to minimize light absorption in the substrate.

Since the chilled figured glass having a fine uneven surface serves to prevent the glare on the module face in the present invention, it is not necessary to form fine unevenness on the light incident side surface of the glass substrate and it is easy to carry out the patterning processes for integration using a laser beam.

The glass substrate, on which thin film solar cells are to be formed, preferably has a light incident side surface as smooth as possible not to scatter a laser beam and not to reduce energy density of the beam during the patterning processes for integration. Specifically, as a range that prevents scattering of a laser beam such as of YAG laser, the surface preferably has an arithmetic mean surface roughness Ra less than 0.005 mm.

In the present invention, the chilled figured glass supplements the strength of the flat glass substrate to retain the strength of the thin film solar battery module. Therefore, the average thickness of the chilled figured glass is preferably more than 3 mm in the case that a module for relatively large power is to be formed. In order to suppress absorption of incident light in such a thick chilled figured glass, it is preferable to use low iron glass for the chilled figured glass.

The chilled figured low iron glass having a fine uneven surface is available in mass production conventionally for purpose of using for a protection cover glass of a solar battery module made with crystal silicon wafers, and thus can be obtained relatively economically.

In the present invention, the unevenness of the light incident side surface of the chilled figured glass must have at least a prescribed roughness to achieve the anti-glare effect caused by diffuse reflection (scattering) of light. On the other hand, the surface roughness must be below a prescribed level so as to retain the strength of the glass plate and prevent dust and the like from being accumulated on the surface and causing reduction in light transmittance. Specifically, the uneven surface of the chilled figured glass preferably has an arithmetic mean surface roughness Ra within the range of 0.001 mm–0.3 mm, more preferably 0.005 mm–0.1 mm.

The inventors have found out the ranges of such values as a result of an overall evaluation of the ant-glare performance, the module strength, the dust and dirt on the glass surface in the outdoors, and the like regarding thin film solar battery modules produced with various surface roughness for the chilled figured glass. When the arithmetic mean surface roughness Ra is below 0.001 mm, the roughness approximates the wavelength of visible light. This means that the light reflected on the glass surface will not be scattered sufficiently, so that sufficient ant-glare effect cannot be achieved. When the arithmetic mean surface roughness Ra exceeds 0.3 mm, the strength of the glass plate having a thickness of 3 mm or less is reduced significantly. Furthermore, when the module is installed with a small inclination angle in the outdoors, the dust and dirt are liable to be accumulated on the surface of the module and not be easily washed away by rain or the like.

As the non-monocrystal silicon type material in the present invention, amorphous silicon, amorphous silicon carbide, amorphous silicon germanium, microcrystal silicon, polycrystalline silicon, and the like can be used. Also, as the semiconductor junction structure of the non-monocrystal silicon type thin film solar cell, single junction, tandem junction, triple junction, or the like such as of pn junction, pin junction, and Shottky barrier junction can be implemented.

In the present invention, the non-monocrystal silicon type thin film solar battery is preferably formed on an insulative flat glass substrate and patterned for integration by a laser beam. Since a flat glass having smooth surfaces on both sides is used for the flat glass substrate, it is easy to carry out the patterning processes for integration using a laser beam.

In the present invention, a moisture proof sealing member is preferably provided on the back side of the non-monocrystal silicon type thin film solar battery (the side opposite to the light incident side) in order to prevent moisture from entering the thin film. The moisture proof sealing member may be a plastic film or a metal sheet, or a laminate including a multi-film of a combination thereof adhered by an adhesive resin such as ethylene-vinyl acetate copolymer (hereinafter referred to as EVA resin), polyvinyl butyral, or the like. For the plastic film, a film of polyester, polyethylene, polypropylene, vinyl chloride, fluorine-contained resin, or the like can be used. For the metal sheet, a sheet of aluminum, zinc, stainless steel, or the like can be used.

In the present invention, a thermal insulation member is preferably provided on the back surface side of the non-monocrystal silicon type thin film solar battery (the side opposite to light incident). As mentioned before, it is generally known that an amorphous thin film solar battery has a property that a higher photoelectric conversion efficiency can be maintained when the temperature of the solar cell is higher during insolation.

It is to be noted that, in the present invention, the space layer at the light incident side (the front side of the solar battery) causes a thermal insulation effect, and heat generated by incident light in the thin film solar battery does not easily escape from the back side due to effect of a thermal insulation member provided on the back side of the solar battery. Therefore, the thin film solar battery can be maintained at a further higher temperature, so that a higher photoelectric conversion efficiency can be achieved when the solar battery module is used outdoors.

For the heat insulation member, glass wool, rock wool, foamed polystyrene, foamed urethane, foamed phenol resin, or the like can be used, and a multi-layer including space layers and glass layers can also be used.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
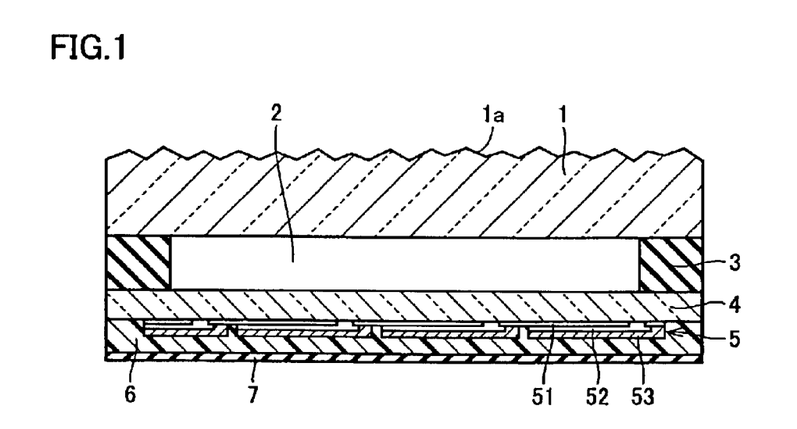
FIG. 1 is a schematic sectional view of a thin film solar battery module according to an embodiment of the present invention.

Referring to FIG. 1, a thin film solar battery module according to an embodiment of the present invention includes a chilled figured glass 1, a space layer 2, a seal spacer 3, a flat glass substrate 4, a plurality of non-monocrystal silicon type thin film solar cells 5 formed on flat glass substrate 4, a seal resin 6, and a back side seal film 7. Chilled figured glass 1, space layer 2 (seal spacer 3), flat glass substrate 4 with non-monocrystal silicon type thin film solar cells 5 formed thereon, seal resin 6, and back side seal film 7 are sequentially stacked in this order from the light incident side.

A figured low iron glass made stronger by thermal treatment, for example, is employed for chilled figured glass 1. Fine unevenness is formed on a surface 1a of the light incident side of chilled figured glass 1 by embossment or the like. A flat soda lime glass that is not chilled, for example, is used for flat glass substrate 4.

Seal spacer 3 is disposed between perimeter edges of chilled figured glass 1 and flat glass substrate 4 to form space layer 2 with a prescribed thickness, and seals up dry air in space layer 2.

EVA resin directed to use for solar cells, for example, is employed for seal resin 6. A multilayered film of PET/aluminum/PET, for example, is used for back side seal film 7.

Each of non-monocrystal silicon type thin film solar cells 5 includes a transparent conductive electrode layer 51, a semiconductor film 52, and a back electrode layer 53 sequentially stacked on the back side (opposite to the light incident side) of flat glass substrate 4.

An $SnO_2$ transparent conductive film, for example, is employed for transparent conductive electrode 51. An amorphous silicon semiconductor film including pin junction, for example, can be employed for semiconductor film 52. A double film including a ZnO transparent conductive film and a thin silver film, for example, can be used for back electrode 53.

According to the embodiment of FIG. 1, since fine unevenness is formed on light incident side surface 1a of chilled figured glass 1, light incident to the module is reflected irregularly (scattered), whereby an anti-glare effect can be exhibited sufficiently. Thus, the problem caused by light reflected from the glass face of the module can be alleviated. Since chilled figured glass 1 carries out the two functions of preventing the glare and retaining the strength, it is possible to reduce thickness of flat glass substrate 4 on which non-monocrystal silicon type thin film solar cells 5 are to be formed. It is not necessary to form fine surface unevenness on flat glass substrate 4. An economical smooth flat soda lime glass can be used for flat glass substrate 4.

Figure 2:
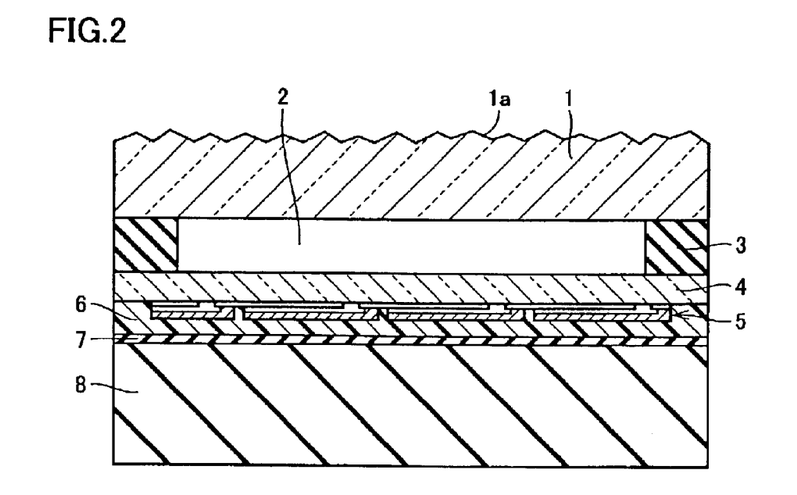
FIG. 2 is a schematic sectional view of a thin film solar battery module according to another embodiment of the present invention.

The sectional view of FIG. 2 shows a thin film solar battery module according to another embodiment of the present invention. The solar battery module of FIG. 2 has a thermal insulator 8 such as a shaped glass wool sheet provided on the back surface of back side seal film 7 (the surface opposite to the light incident side), in addition to the structure of FIG. 1.

Thermal insulator 8 over the back side of non-monocrystal silicon type thin film solar cells 5 serves to prevent heat generated by incident light in the thin film solar battery from escaping from the back side. Therefore, thin film solar cell 5 can be maintained at a further higher temperature, so that a further higher photoelectric conversion efficiency can be maintained when the solar battery module is used outdoors.

Figure 3:
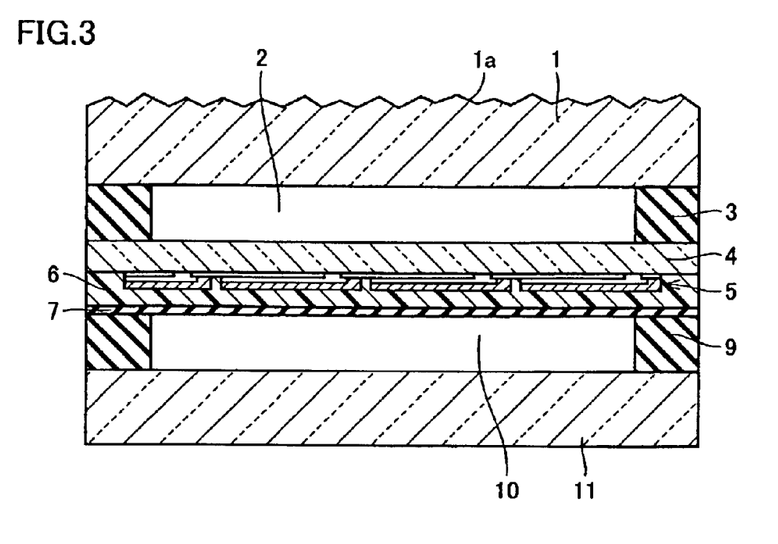
FIG. 3 is a schematic sectional view of a thin film solar battery module according to a further embodiment of the present invention.

Referring to FIG. 3, a thin film solar battery module according to a further embodiment of the present invention is provided with a seal spacer 9 and a flat glass 11 on the back side of back side seal film 7, thereby forming a space layer 10 over the back side of non-monocrystal silicon type thin film solar cells 5, in addition to the structure of FIG. 1.

Provision of a thermal insulation member formed of space layer 10 and flat glass 11 over the back side of non-monocrystal silicon type thin film solar cells 5 prevents heat generated by incident light in the thin film solar cells from easily escaping through the back side. Therefore, the thin film solar battery can be maintained at higher temperature, so that a furthermore higher photoelectric conversion efficiency can be achieved by the solar battery module in the outdoors.

Figure 4:
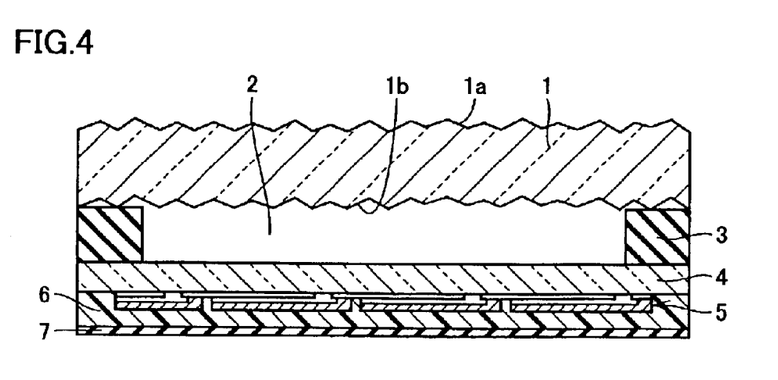
FIG. 4 is a schematic sectional view of a thin film solar battery module according to a further embodiment of the present invention.

Referring to FIG. 4, a thin film solar battery module according to a further embodiment of the present invention has a back plane 1b (opposite to the light incident side) of chilled figured glass 1 provided with fine surface unevenness for the anti-glare effect, in addition to the structure of FIG. 1.

By providing both sides of chilled figured glass 1, i.e., front surface 1a and back plane 1b with fine surface unevenness, the anti-glare effect can be further improved.

Figure 5:
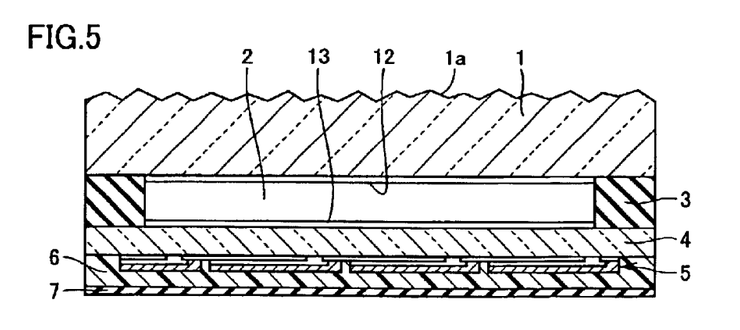
FIG. 5 is a schematic sectional view of a thin film solar battery module according to a further embodiment of the present invention.

Referring to FIG. 5, a thin film solar battery module according to a further embodiment of the present invention is provided with an anti-reflection film 12 on the back plane (opposite to the light incident side) of chilled figured glass 1 and another anti-reflection film 13 on the front surface (the light incident side) of flat glass substrate 4, in addition to the structure of FIG. 1.

Anti-reflection films 12 and 13 provided on the glass planes facing space layer 2 serve to further reduce light reflection.

EXAMPLE 1

A thin film solar battery module as shown in FIG. 1 was produced for Example 1 of the present invention. Specifically, an $SnO_2$ transparent electrode layer 51 was formed by thermal CVD on a non-chilled flat soda lime glass substrate 4 of 1.8 mm thickness and 650 mm×910 mm area. On $SnO_2$ transparent electrode layer 51, an amorphous silicon semiconductor film 52 of a single junction structure including a p-i-n junction was formed by plasma CVD. Then, back electrode layer 53 including a ZnO transparent conductive film and a thin silver film was deposited by DC magnetron sputtering thereby forming amorphous silicon thin film solar cells 5.

It is to be noted that $SnO_2$ transparent electrode layer 51, amorphous silicon film 52 and back electrode layer 53 were divided into stripes through a YAG laser beam after formation of respective layers. The elongated rectangular solar cells 5 are electrically connected in series in the narrow width direction for integration.

Then, chilled figured low ion flat glass 1 having one side (the light incident side) subjected to embossment of an arithmetic mean surface roughness Ra of 0.05 mm and having an average thickness of 3.2 mm, seal spacer 3 of 6 mm thickness, flat glass substrate 4 supporting amorphous silicon thin film solar cells 5, EVA resin sheet 6 of 0.4 mm thickness directed to use for solar cells, and a multilayered film 7 of PET/aluminum/PET were sequentially stacked in this order in a unitary manner. Thus, the thin film solar battery module of Example 1 was produced.

The produced thin film solar battery module of Example 1 was installed vertically on the south-facing wall on the second story of a house and observed from positions 20 meters away from the module in the directions of the south, southeast, and southwest during daytime in fine weather. As a result, no appreciable glare due to reflected sun light from the face of the module nor reflection of the neighborhood scene mirrored on the face of the module was observed and it was confirmed that the module exhibited a good appearance.

The thin film solar battery module of Example 1 was also installed on the roof of a house (with an inclination of 10 degrees), and subjected to an exposure test in the outdoors for 100 days. As a result, it was confirmed that there was no change in appearance of the thin film solar battery module, and the surface of the chilled figured glass exhibited little remaining dust and dirt.

The thin film solar battery module of Example 1 was also subjected to a load test. The module was placed horizontally with the light incident side upwards over two H-shaped steel bars so as to be supported only by the end portion at either side in the longitudinal direction. A bag filled with dry sand was placed in a manner such that a homogeneous load is applied on chilled figured glass 1. Even under a pressure of 1500 $N/m^2$ applied, the thin film solar batter module did not fracture. The difference in the electrical output of the module before and after that load test was within 1%, and it was confirmed that there was no change in the electrical characteristics.

Comparative Example 1

As Comparative Example 1, a thin film solar battery module was fabricated in a manner similar to that of Example 1, except that a low iron flat glass with both sides smooth was used instead of chilled figured glass 1 of FIG. 1.

The produced thin film solar battery module of Comparative Example 1 was installed at a wall of a house and observed from the south, southeast, and southwest directions. As a result, there was a direction in which the glare of reflected sun light was seen on the module face. Furthermore, the module face acted like a mirror to reflect the neighborhood scene and degraded the appearance on the wall of the architecture.

Comparative Example 2

In Comparative Example 2, a low iron flat glass of 4 mm thickness was used for the flat glass substrate on which the thin film solar cells are to be formed. A chilled figured glass and a space layer were not provided on the light incident side of the flat glass substrate. After formation of the thin film solar cells, fluorine-type coating with glass beads distributed therein was applied on the light incident side of the low iron flat glass substrate to form fine surface unevenness. With the remaining conditions similar to those of Example 1, the thin film solar battery module of Comparative Example 2 was produced.

The thin film solar battery module of Comparative Example 2 was installed vertically on the south-facing wall on the second story of a house and observed from positions 20 meters away from the module in the directions of the south, southeast, and southwest. As a result, glare due to reflected sun light from the face of the module and reflection of the neighborhood scene mirrored on the surface was hardly observed. However, the appearance of the module was not good, because there was local variation in the appearance due to the beads not being homogeneously distributed on the module face.

The thin film solar battery module of Comparative Example 2 was also installed on the roof (with an inclination of 10 degrees) of a house, and subjected to an exposure test in the outdoors for 100 days. As a result, it was observed that dust and dirt remained over the surface of the resin layer on the glass substrate of the thin film solar battery module and the appearance of the module face was partially clouded. When the module face was rubbed with textile waste to wipe away the dust and dirt, fine scuffs were caused on the resin layer on the glass substrate surface.

EXAMPLE 2

In Example 2, a thin film solar battery module was produced in a manner similar to that of Example 1, except that the arithmetic mean surface roughness Ra of chilled figured glass 1 was altered to 0.01 mm.

The produced thin film solar battery module of Example 2 was installed vertically on the south-facing wall on the second story of a house and observed from positions 20 meters away from the module in the directions of the south, southeast, and southwest during daytime in fine weather. As a result, no appreciable glare due to reflected sun light from the face of the module nor reflection of the neighborhood scene mirrored on the face of the module was observed and it was confirmed that the module exhibited a good appearance.

The thin film solar battery module of Example 2 was also installed on the roof of a house (with an inclination of 10 degrees), and subjected to an exposure test in the outdoors for 100 days. As a result, it was confirmed that there was no change in appearance of the thin film solar battery module, and the surface of chilled figured glass 1 exhibited little remaining dust and dirt.

The thin film solar battery module of Example 2 was also subjected to a load test. The module was placed horizontally with the light incident surface upwards over two H-shaped steel bars so as to be supported only by the end portion at either side in the longitudinal direction. A bag filled with dry sand was placed in a manner such that a homogeneous load is applied on chilled figured glass 1. Even under a pressure of 1500 N/m$^2$ applied, the thin film solar batter module did not fracture. The difference in the electrical output of the module before and after that load test was within 1%, and it was confirmed that there was no change in the electrical characteristics.

EXAMPLE 3

In Example 3, a thin film solar battery module was produced in a manner similar to that of Example 1, except that a shaped glass wool sheet 8 of 30 mm thickness was attached on the back side of the module through an adhesive agent as shown in FIG. 2.

The produced thin film solar battery module of Example 3 was installed vertically on the south-facing wall on the second story of a house and observed from positions 20 meters away from the module in the directions of the south, southeast, and southwest during daytime in fine weather. As a result, no appreciable glare due to reflected sun light from the face of the module nor reflection of the neighborhood scene mirrored on the face of the module was observed and it was confirmed that the module exhibited a good appearance.

The thin film solar battery module of Example 3 was also installed on the roof of a house (with an inclination of 10 degrees), and subjected to an exposure test in the outdoors for 100 days. As a result, it was confirmed that there was no change in appearance of the thin film solar battery module, and the surface of chilled figured glass 1 exhibited little remaining dust and dirt.

The thin film solar battery module of Example 3 was also subjected to a load test. The module was placed horizontally with the light incident surface upwards over two H-shaped steel bars so as to be supported only by the end portion at either side in the longitudinal direction. A bag filled with dry sand was placed in a manner such that a homogeneous load is applied on chilled figured glass 1. Even under a pressure of 1500 N/m$^2$ applied, the thin film solar batter module did not fracture. The difference in the electrical output of the module before and after that load test was within 1%, and it was confirmed that there was no change in the electrical characteristics.

Furthermore, with regards to the thin film solar battery modules of Example 3 and Example 1, the temperature of thin film solar cells 5 was measured by a thermocouple incorporated in the module at culmination in a day of June in fine weather when the outdoor air temperature was 25° C. The temperature of solar cells 5 in the module of Example 3 was higher by 16° C. than that of Example 1. Also, the temperature of solar cells 5 in the module of Example 3 was higher by 31° C. than that of Comparative Example 2 that does not include chilled figured glass 1 and space layer 2. It was confirmed that the module of Example 3 had good thermal insulation capability.

Furthermore, the thin film solar battery module of Example 3 subjected to an exposure test in the outdoors for 100 days had its photoelectric conversion efficiency measured in the standard state of 1000 W/m$^2$ light irradiation at 25° C. using a solar simulator. The module of Example 3 had the same photoelectric conversion efficiency before and after the exposure test, which was approximately 1.1 times higher than the conversion efficiency of the module of Example 1 subjected to a similar exposure test in the outdoors. Furthermore, the conversion efficiency of the module of Example 3 after the exposure test was 1.2 times higher than that of the module of Comparative Example 2 subjected to a similar exposure test in the outdoors (the conversion efficiency of Comparative Example 2 before the exposure test was identical to that of the module of Example 3 before the exposure test).

EXAMPLE 4

For Example 4, a thin film solar battery module was produced in a manner similar to that of Example 1, except that a fluorine-contained resin of a low index of refraction (made by Asahi Glass Co., Ltd.; product name: CYTOP; refraction index 1.34) was applied on respective sides of chilled figured glass 1 and flat glass substrate 4 facing space layer 2 to form respective anti-reflection films 12 and 13 having a thickness of 2 $\mu$m as shown in FIG. 5.

The produced thin film solar battery module of Example 4 was installed vertically on the south-facing wall on the second story of a house and observed from positions 20 meters away from the module in the directions of the south, southeast, and southwest directions during daytime in fine weather. As a result, no appreciable glare due to reflected sun light from the face of the module nor reflection of the neighborhood scene mirrored on the face of the module was observed and it was confirmed that the module exhibited a good appearance.

The thin film solar battery module of Example 4 was also installed on the roof of a house (with an inclination of 10 degrees), and subjected to an exposure test in the outdoors for 100 days. As a result, it was confirmed that there was no change in appearance of the thin film solar battery module, and the surface of chilled figured glass 1 exhibited little remaining dust and dirt.

The thin film solar battery module of Example 4 was also subjected to a load test. The module was placed horizontally with the light incident surface upwards over two H-shaped steel bars so as to be supported only by the end portion at either side in the longitudinal direction. A bag filled with dry sand was placed in a manner such that a homogeneous load is applied on chilled figured glass 1. Even under a pressure of 1500 N/m$^2$ applied, the thin film solar batter module did not fracture. The difference in the electrical output of the module before and after that load test was within 1%, and it was confirmed that there was no change in the electrical characteristics.

Although the photoelectric conversion efficiency of the thin film solar cells per se of Example 4 was identical to that of Example 1, the photoelectric conversion efficiency of the thin film solar battery module of Example 4 was higher by about 4% than that of Example 1.

EXAMPLE 5

For Example 5, a thin film solar battery module was produced in a manner similar to that of Example 1, except that a thermal insulation member of 6 mm thickness including a space layer (filled with dry air) 10 and a flat glass 11 was provided on the back side of the module, as shown in FIG. 3.

The produced thin film solar battery module of Example 5 was installed vertically on the south-facing wall on the second story of a house and observed from positions 20 meters away from the module in the directions of the south, southeast, and southwest during daytime in fine weather. As a result, no appreciable glare due to reflected sun light from the face of the module nor reflection of the neighborhood scene mirrored on the face of the module was observed and it was confirmed that the module exhibited a good appearance.

The thin film solar battery module of Example 5 was also installed on the roof of a house (with an inclination of 10 degrees), and subjected to an exposure test in the outdoors for 100 days. As a result, it was confirmed that there was no change in appearance of the thin film solar battery module, and the surface of chilled figured glass 1 exhibited little remaining dust and dirt.

The thin film solar battery module of Example 5 was also subjected to a load test. The module was placed horizontally with the light incident surface upwards over two H-shaped steel bars so as to be supported only by the end portion at either side in the longitudinal direction. A bag filled with dry sand was placed in a manner such that a homogeneous load is applied on chilled figured glass 1. Even under a pressure of 1500 N/m$^2$ applied, the thin film solar batter module did not fracture. The difference in the electrical output of the module before and after that load test was within 1%, and it was confirmed that there was no change in the electrical characteristics.

Furthermore, with regards to the thin film solar battery modules of Example 5 and Example 1, the temperature of thin film solar cells 5 was measured by a thermocouple incorporated in the module at culmination in a day of June in fine weather when the outdoor air temperature was 25° C. The temperature of solar cells 5 in the module of Example 5 was higher by 16° C. than that of Example 1. Also, the temperature of solar cells 5 in the module of Example 5 was higher by 31° C. than that of Comparative Example 2 that does not include chilled figured glass 1 and space layer 2. It was confirmed that the module of Example 5 had good thermal insulation capability.

Furthermore, the thin film solar battery module of Example 5 subjected to an exposure test in the outdoors for 100 days had its photoelectric conversion efficiency measured in the standard state of 1000 W/m$^2$ light irradiation at 25° C. using a solar simulator. The module of Example 5 had the same photoelectric conversion efficiency before and after the exposure test, which was approximately 1.1 times higher than the conversion efficiency of the module of Example 1 subjected to a similar exposure test in the outdoors. Furthermore, the conversion efficiency of the module of Example 5 after the exposure test was 1.2 times higher than that of the module of Comparative Example 2 subjected to a similar exposure test in the outdoors (the conversion efficiency of Comparative Example 2 before the exposure test was identical to that of the module of Example 5 before the exposure test).

As described above, the thin film solar battery module of the present invention uses an economical non-chilled flat glass for the glass substrate on which non-monocrystal silicon type thin film solar cells are to be formed, and a chilled figured glass having a fine uneven surface is disposed on the light incident side of that glass substrate with a space layer therebetween. Therefore, the problem caused by light reflected on the glass surface of the module can be alleviated. Sufficient strength of the module can also be ensured without reduction in the power generating efficiency. Furthermore, it is possible to improve stability in the electrical output characteristics of the module used outdoors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film solar battery module comprising:

a flat glass substrate with non-monocrystal silicon thin film solar cells formed thereon, a space layer, and a chilled figured glass, stacked in this order so that the flat glass substrate and the chilled figured glass are on a common side of the thin film solar cells, and wherein said chilled figured glass has fine unevenness on at least its light incident side surface to achieve an anti-glare effect.

2. The thin film solar battery module according to claim 1, wherein an arithmetic mean surface roughness Ra of said fine unevenness is within a range of 0.001 mm–0.3 mm.

3. The thin film solar battery module according to claim 1, wherein said chilled figured glass is a low iron glass plate having an average thickness of more than 3 mm.

4. The thin film solar battery module according to claim 1, wherein said flat glass substrate is a flat soda lime glass having a thickness of less than 3 mm.

5. The thin film solar battery module according to claim 1, wherein said flat glass substrate is a flat glass that is not chilled.

6. The thin film solar battery module according to claim 1, wherein said space layer is a dry air layer, a dry inert gas layer or a vacuum layer.

7. The thin film solar battery module according to claim 1, wherein at least one of a surface of said chilled figured glass and a surface of said glass substrate on the space layer side is provided with an anti-reflection film.

8. The thin film solar battery module according to claim 1, wherein a thermal insulation member is provided on the back side of said non-monocrystal silicon thin film solar cells.

9. The thin film solar battery module of claim 1, wherein said space layer comprises an air gap which may optionally be filled with gas.

10. A thin film solar battery module comprising:

a non-chilled flat glass substrate with thin film solar cells formed thereon, a thermally insulating gap, and a chilled figured glass, stacked in this order so that the non-chilled flat glass substrate and the chilled figured glass are on a common side of the solar cells, and wherein said chilled figured glass has fine unevenness on at least its light incident side surface to achieve an anti-glare effect.

11. The thin film solar battery module of claim 10, wherein said thermally insulating gap is filled with an inert gas.

12. The thin film solar battery module according to claim 10, wherein an arithmetic mean surface roughness Ra of said fine unevenness is within a range of 0.001 mm to 0.3 mm.

13. The thin film solar battery module according to claim 10, wherein said chilled figured glass is a low iron glass plate having an average thickness of more than 3 mm.

\* \* \* \* \*